(12) United States Patent
Fujisawa

(10) Patent No.: US 7,394,886 B2
(45) Date of Patent: Jul. 1, 2008

(54) SEMICONDUCTOR DEVICE WITH LATENCY COUNTER

(75) Inventor: Hiroki Fujisawa, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 99 days.

(21) Appl. No.: 11/543,233

(22) Filed: Oct. 5, 2006

(65) Prior Publication Data

US 2007/0076516 A1 Apr. 5, 2007

(30) Foreign Application Priority Data

Oct. 5, 2005 (JP) ............................. 2005-292395

(51) Int. Cl.
*H03K 23/00* (2006.01)

(52) U.S. Cl. .................. 377/118; 377/122; 377/124

(58) Field of Classification Search ................ None
See application file for complete search history.

(56) References Cited

OTHER PUBLICATIONS

Song et al., "A 1.2Gb/s/pin Double Data Rate SDRAM with On-Die-Termination," IEEE International Solid-State Circuits Conference 2003/Session 17/SRAM and DRAM/Paper 17.8, 2003.

*Primary Examiner*—Tuan T Lam

(74) *Attorney, Agent, or Firm*—McDermott Will & Emery LLP

(57) ABSTRACT

A latency counter of a semiconductor device comprises a single cyclic signal generator and a command delay circuit. The single cyclic signal generator cyclically produces 0-th to n-th base signals based on an internal clock signal. The command delay circuit comprises 0-th to n-th latch elements and latches an internal command by means of a p-th latch element (p is an integer; $0 \leq p \leq n$) in response to a q-th base signal (q is an integer; $0 \leq q \leq n$) and to output the latched internal command corresponding to the latency timeout signal therefrom in response to a r-th base signal (r is an integer; $0 \leq r \leq n$), where $r=q+s$ if $q+s \leq n$, while $r=q+s-(n+1)$ if $q+s > n$, s being a natural number equal to or less than n.

15 Claims, 4 Drawing Sheets

SEMICONDUCTOR DEVICE WITH LATENCY COUNTER

BACKGROUND OF THE INVENTION

This invention relates to a semiconductor device such as a semiconductor memory device, e.g. a dynamic random access memory (DRAM) device or a device including such semiconductor memory device. In particular, the present invention relates to a latency counter included in the semiconductor device.

A latency counter included in a DRAM device is proposed in an article entitled "A1.2 Gb/s/pin Double Data Rate SDRAM with On-Die-Termination" by Ho Young Song, et. al, ISSCC 2003/SESSION 17/SRAM AND DRAM/PAPER 17.8. The proposed latency counter is suitably operative at a higher frequency than another conventional latency counter mainly comprising a shift register.

However, the proposed latency control scheme requires two ring counters which dissipate large power.

SUMMARY OF THE INVENTION

It is an object of the present invention to provide a semiconductor device with a latency counter which can reduce power consumption in comparison with the proposed latency counter.

One aspect of the present invention provides a semiconductor device which comprises a new latency counter. The latency counter is configured to hold an internal command for a predetermined period in accordance with a predetermined latency by using an internal clock signal to produce a latency timeout signal. The latency counter comprises a single cyclic signal generator and a command delay circuit. The single cyclic signal generator is for example a single ring counter and is configured to cyclically produce 0-th to n-th base signals based on the internal clock signal. The command delay circuit comprises 0-th to n-th latch elements and is configured to latch the internal command by means of a p-th latch element (p is an integer; $0 \leq p \leq n$) in response to a q-th base signal (q is an integer; $0 \leq q \leq n$) and to output the latched internal command corresponding to the latency timeout signal therefrom in response to a r-th base signal (r is an integer; $0 \leq r \leq n$), where $r = q+s$ if $q+s \leq n$, while $r = q+s-(n+1)$ if $q+s > n$, s being a natural number equal to or less than n.

According to one aspect of the present invention, two cyclic signal generators are not necessary; the base signals produced by the single cyclic signal generator are used for latching the internal command at the latch element and for fetching the latched internal command therefrom. Therefore, power consumption at the semiconductor device can be reduced.

An appreciation of the objectives of the present invention and a more complete understanding of its structure may be had by studying the following description of the preferred embodiment and by referring to the accompanying drawings.

Figure 1:
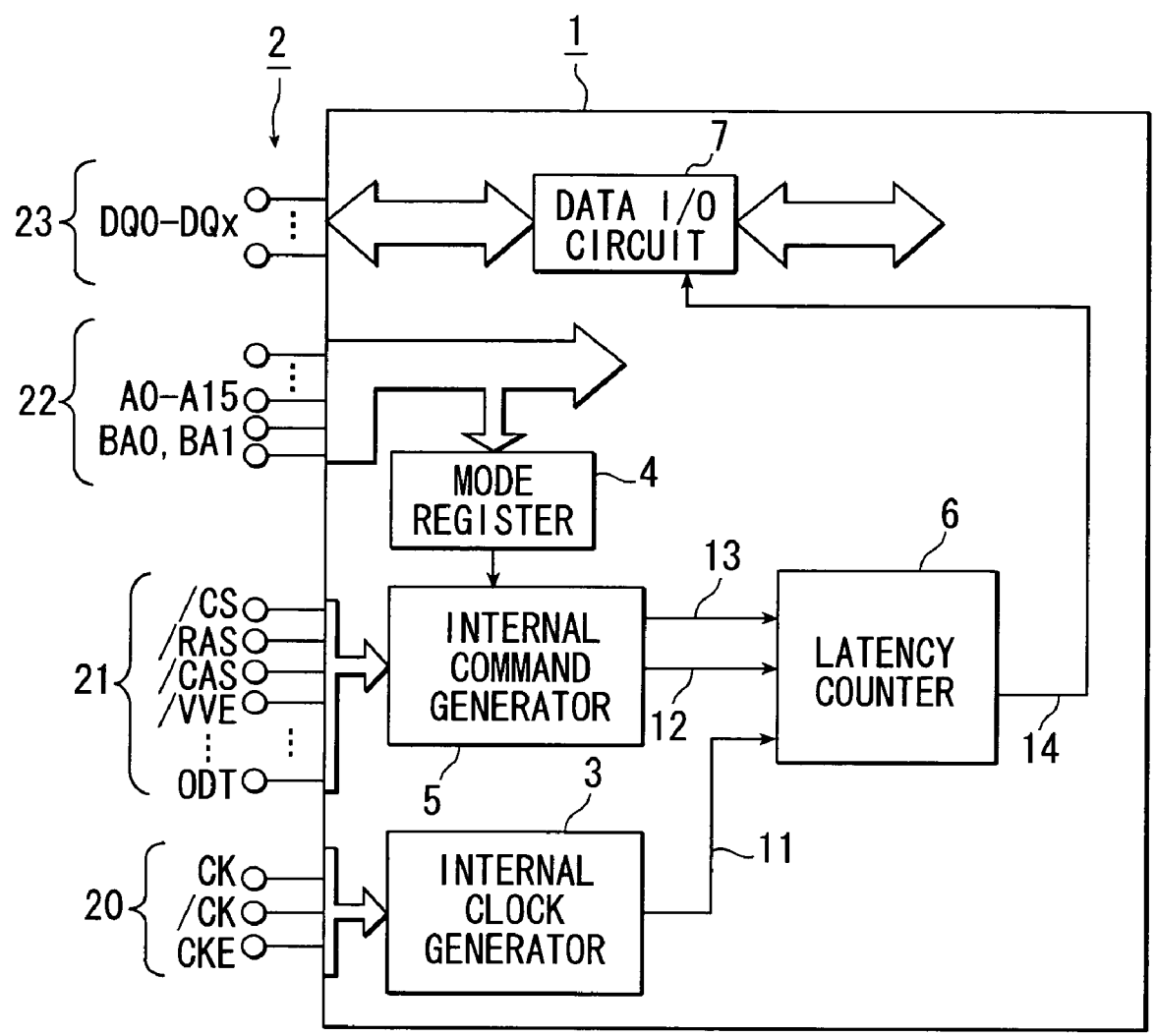
FIG. 1 is a block diagram schematically showing a semiconductor device in accordance with one embodiment of the present invention.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DESCRIPTION OF PREFERRED EMBODIMENTS

With reference to FIG. 1, a semiconductor device 1 according to an embodiment of the present invention is a DRAM device and comprises a plurality of terminals 2 including clock related terminals 20, command related terminals 21, address related terminals 22 and data related terminals 23. In this embodiment, the clock related terminals 20 are terminals for clock CK, clock bar /CK and clock enable CKE; the command related terminals 21 are terminals for chip select bar /CS, row address strobe bar /RAS, column address strobe bar /CAS, write enable bar /WE and ODT (On Die Termination) function; the address related terminals are terminals for 16-bit address A0 to A15 and 2-bit bank address BA0, BA1; the data related terminals 23 are terminals for data DQ0 to DQx.

The illustrated semiconductor device 1 further comprises an internal clock generator 3, a mode register 4, an internal command generator 5, a latency counter 6 and a data input/output (I/O) circuit 7. The internal clock generator 11 is for example a delay locked loop (DLL) circuit in this embodiment and produces an internal clock signal 11 in response to signals at the clock related terminals 20. The internal clock signal 11 leads, in phase, the clock CK by a time period of (t3+t4) shown in FIG. 3. Turning back to FIG. 1, the mode register 4 stores latency information as to a predetermined latency, which is set in accordance with a certain combination of address signals. The internal command generator 5 is comprised of for example a command decoder and a control logic in part and issues an internal command 12 in response to a command indicated by a certain combination of signals at the command related terminals 21. The internal command generator 5 also issued a shift signal 13 indicative of a shift value in response to the predetermined latency contained in the mode register 4.

The latency counter 6 holds the internal command 12 for a predetermined period in accordance with the predetermined latency to produce a latency timeout signal 14 indicative of a lapse of a predetermined latency period equal to a product of the predetermined latency and one clock cycle of the internal clock signal or the clock CK. The data I/O circuit 7 comprises for example an I/O buffer, an ODT control switch, a termination resister, a data FIFO (First-In-First-Out) and so on. The data I/O circuit 7 outputs data through the data related terminals 23 upon a read operation, while receiving data through the data related terminals 23 upon a write operation. The data I/O circuit 7 terminates a data input path by the use of the termination resister when the ODT control switch turns on. In the read operation, the aforementioned latency timeout signal 14 indicates a timing of data output from the data I/O circuit 7. In the write operation, the latency timeout signal 14 indicates a timing of data reception by the data I/O circuit 7. In an ODT mode, the latency timeout signal 14 indicates a turn-on timing of the ODT control switch.

Figure 2:
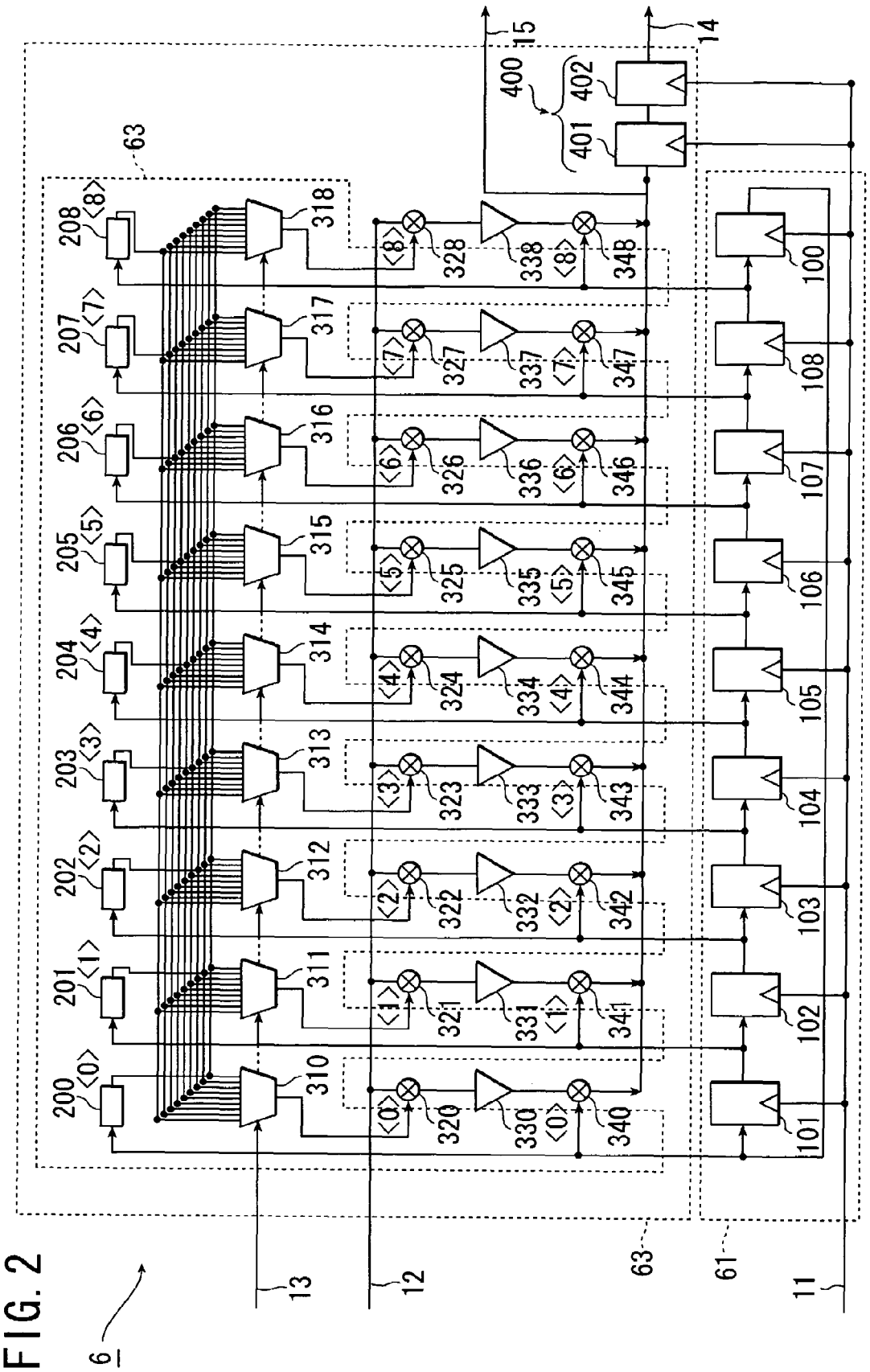
FIG. 2 is a circuit diagram schematically showing a latency counter included in the semiconductor device of FIG. 1.

With reference to FIG. 2, the latency counter 6 comprises a single cyclic signal generator 61 and a command delay circuit 63. The single cyclic signal generator 61 cyclically produces 0-th to 8-th base signals based on the internal clock signal 11. In this embodiment, the single cyclic signal generator 61 is a single ring counter which comprises 0-th to 8-th flip-flops 100 to 108. The outputs of the 0-th to the 8-th flip-flops 100 to 108 are 0-th to 8-th base signals and are input into the subsequent flip-flops, i.e. the 1-th to the 0-th flip-flops 101 to 108, respectively.

The command delay circuit 63 comprises an entry/exit controller 65, 0-th to 8-th entry gates 320 to 328, 0-th to 8-th latch elements 330 to 338 and 0-th to 8-th exit gates 340 to 348. The entry/exit controller 65 produces 0-th to 8-th entry signals and 0-th to 8-th exit signals from the 0-th to the 8-th base signals. The 0-th to the 8-th entry signals are supplied to the 0-th to the 8-th entry gates 320 to 328 to cause the 0-th to the 8-th entry gates 320 to 328 to open, respectively. On the other hand, the 0-th to the 8-th exit signals are supplied to the 0-th to the 8-th exit gates 340 to 348 to cause the 0-th to the 8-th exit gates 340 to 348 to open, respectively.

As shown in FIG. 2, the shift signal 13 determines relative correspondence between the 0-th to the 8-th base signals and the 0-th to the 8-th entry signals, as described in detail afterwards. In this embodiment, the command delay circuit 63 directly supplies the 0-th to the 8-th base signals as the 0-th to the 8-th exit signals to the 0-th to the 8-th exit gates 340 to 348. However, the present invention is not limited thereto. The command delay circuit 63 may cyclically shift relative correspondence between the 0-th to the 8-th base signals and the 0-th to the 8-th exit signals.

The entry/exit controller 65 comprises 0-th to 8-th delay elements 200 to 208 and 0-th to 8-th selectors 310 to 318. The 0-th to 8-th delay elements 200 to 208 delay the 0-th to the 8-th base signals to produce 0-th to 8-th delayed base signals, respectively. The 0-th to the 8-th delay elements 200 to 208 have a common delay period which is equal to an inevitable delay period due to circuitry of the semiconductor device. In detail, the inevitable delay period is the sum of time periods t1 to t4 illustrated in FIG. 3; t1 is a delay time between the command related terminals 21 and an input of the latency counter 6; t2 is an input delay time at the latency counter 6; t3 is an output delay time at the latency counter 6; and t4 is a delay time between an output of the latency counter 6 and the operation of the data I/O circuit 7.

The 0-th to the 8-th delayed base signals are input into each of the 0-th to the 8-th selectors 310 to 318 so that each of the 0-th to the 8-th selectors 310 to 318 selects one of the 0-th to the 8-th delayed base signals as the entry signal in accordance with the shift signal 13. Because the shift signal 13 has a shift value equal to 8 in this embodiment, the 8th selector 318 selects the 0th delayed signal as the 8th entry signal. Likewise, the 0th selector 310 selects the 1st delayed signal as the 0th entry signal, the 1st selector 311 selects the 2nd delayed signal as the 1st entry signal, and the 7th selector 317 selects the 8th delayed signal as the 7th entry signal.

In this embodiment, the delay elements 200 to 208 are connected between the flip-flops 100 to 108 of the single cyclic signal generator 63 and the selectors 310 to 318. However, the present invention is not limited thereto. The delay elements 200 to 208 may be connected between the selectors 310 to 318 and the entry gates 320 to 328, respectively. Furthermore, if the inevitable delay period substantially presents no problem in connection with an operation frequency, the delay elements 200 to 208 may be omitted.

In addition, the selectors 310 to 318 are connected between the delay elements 200 to 208 and the entry gates 320 to 328 in this embodiment. However, the present invention is not limited thereto. The selectors 310 to 318 may be connected between the flip-flops 100 to 108 of the single cyclic signal generator 63 and the exit gates 340 to 348. In other words, the shifted base signal by the selectors 310 to 318 may be supplied as the exit signals to the exit gates 340 to 348.

The 0-th to the 8-th entry gates 320 to 328 are also connected to a line on which the internal command 12 is transmitted. When opening in accordance with the corresponding one of the 0-th to the 8-th entry signals, each of the 0-th to the 8-th entry gates 320 to 328 allows the internal command 12 to pass therethrough. The 0-th to the 8-th latch elements 330 to 338 are connected to the 0-th to the 8-th entry gates 320 to 328, respectively. Each of the 0-th to the 8-th latch elements 330 to 338 latches the internal command 12 passing through the corresponding one of the 0-th to the 8-th entry gates 320 to 328. Each of the latch elements 330 to 338 is for example a cross-coupled inverter. Each latch element may be a flip-flop; in that case, the entry gate can be omitted. The 0-th to the 8-th exit gates 340 to 348 are connected to the 0-th to the 8-th latch elements 330 to 338, respectively. When opening in accordance with the corresponding one of the 0-th to the 8-th exit signals, each of the 0-th to the 8-th exit gates 340 to 348 allows the latched internal command 15 to pass therethrough if the corresponding one of the 0-th to the 8-th latch elements 330 to 338 has latched the internal command 12.

Thus, the illustrated command delay circuit 63 latches the internal command 12 by means of a p-th latch element (p is an integer; $0 \leq p \leq n$) in response to a q-th base signal (q is an integer; $0 \leq q \leq n$) and to output the latched internal command corresponding to the latency timeout signal therefrom in response to a r-th base signal (r is an integer; $0 \leq r \leq n$). In general, the following condition is fulfilled:

$r = q+s$ if $q+s \leq n$, or $r = q+s-(n+1)$ if $q+s > n$, where s is the shift value indicated by the shift signal 13 and is a natural number equal to or less than n. Especially, in this embodiment, $p=r=8$.

With reference to FIG. 2, the command delay circuit 63 further comprises 2-bit shift register 400. The 2-bit shift register 400 consists of two flip-flops 401, 402 connected in series and is operative based on the internal clock signal 11. The 2-bit shift register 400 delays the latched internal command 15 by 2 clock cycles of the internal clock signal 11 to produce the latency timeout signal 14. The 2-bit shift register 400 may be a register or t-bit shift register (t is a natural number larger than one) in consideration of a delay period applied to the latched internal command 15. The shift register 400 may be omitted. However, the shift register 400 is preferably used for shortening the output delay time t3 at the latency counter 6.

Figure 3:
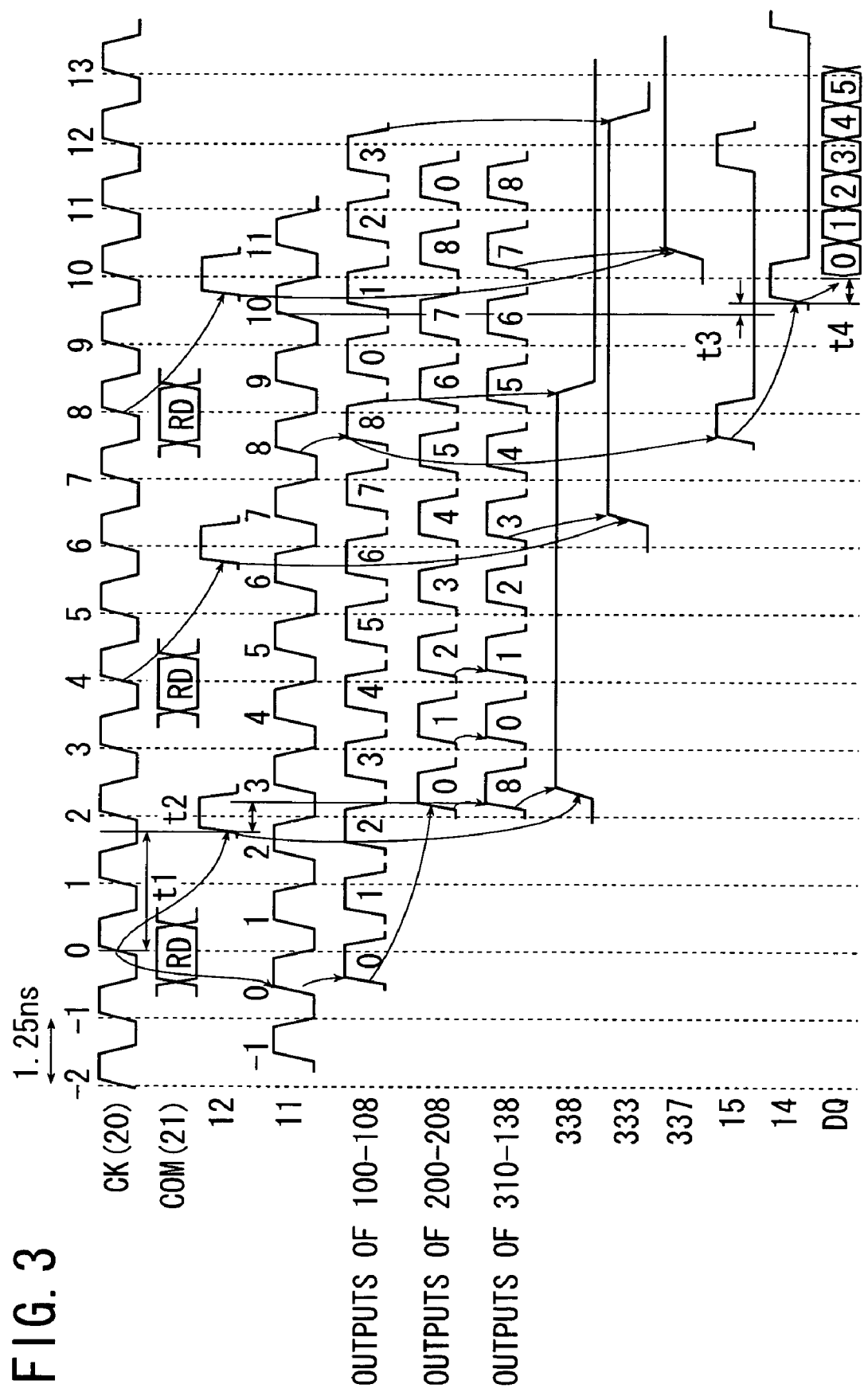
FIG. 3 is a timing chart showing operations of the latency counter of FIG. 2.

Now, explanation will be made about operations of the semiconductor device 1, with further reference to FIG. 3. The internal clock signal 11 leads the clock CK (20) by the time period (t3+t4). On the other hand, a read command input into the command related terminals 21 at CK=0 reaches at the latency counter 6 at a time of (t1+t2). The delay element 200 absorbs the time difference (the sum of t1 to t4). Therefore, the 8th latch element 338 can surely latch the internal command 12 when the entry gate 328 opens in accordance with the 8th entry signal output from the 8th selector 318. The latched internal command 15 is output from the 8th latch element 338 when the exit gate 348 opens in accordance with the 8th exit signal, i.e. the output of the 8th flip-flop 108. The latched internal command 15 is delayed by the 2 bit shift register 400 and is output as the latency timeout signal 15. When the time t4 is passed after the issue of the latency timeout signal 15, multiple data are output through the data related terminals 23 in burst mode. Likewise, another internal command corresponding to a read command at CK=4 is latched by the 3rd latch element 333 when the entry gate 323 opens in accordance with the 3rd entry signal output from the 3rd selector 313. Yet another internal command to a read command at CK=8 is latched by the 7th latch element 337 when the entry gate 327 opens in accordance with the 7th entry signal output from the 7th selector 317. As apparent from FIG. 3, the latch operations at the latch elements 338, 333, 337 are independent of each other.

Figure 4:
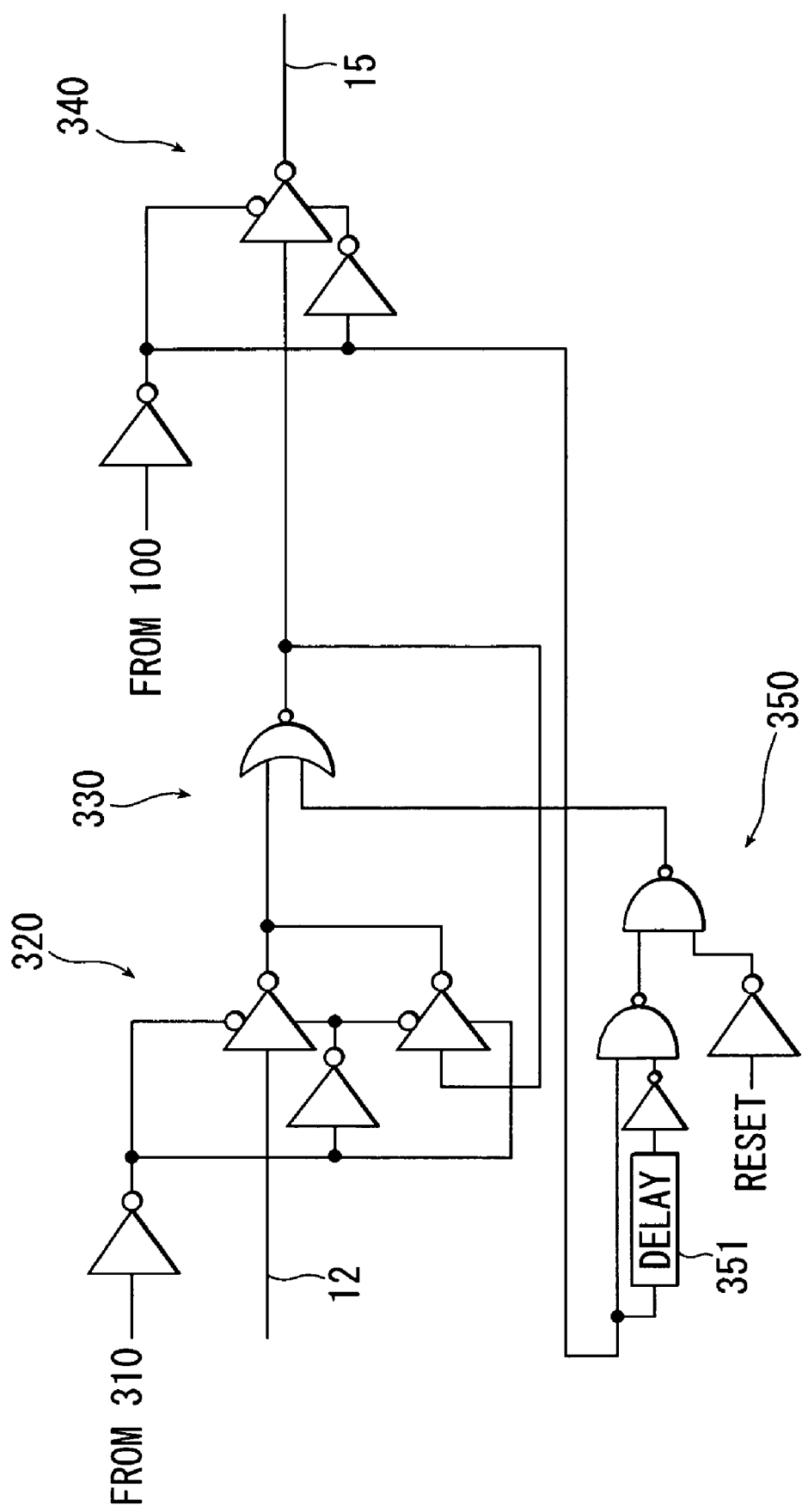
FIG. 4 is a circuit diagram schematically showing a modification for a latch section with self-reset function.

Each of the latch elements 330 to 338 may have a reset function. With reference to FIG. 4, a cross-coupled inverter based latch is used as the latch element 330. One of inverters is replaced with a 2-input NOR circuit. One of inputs is a reset signal supplied from a reset section 350. The reset section 350 resets the state of the latch element 330 when a predetermined time is passed after the latched internal command 15 is output through the exit gate 340. The predetermined time is adjusted by a delay 351 included in the reset section 350. The reset section 350 also resets the state of the latch element 330 when a reset instruction RESET is input into the reset section 350. The reset instruction RESET is supplied to the reset section 350, for example, upon a startup of the semiconductor device 1.

While there has been described what is believed to be the preferred embodiment of the invention, those skilled in the art will recognize that other and further modifications may be made thereto without departing from the sprit of the invention, and it is intended to claim all such embodiments that fall within the true scope of the invention.

What is claimed is:

1. A semiconductor device with a latency counter, the latency counter configured to hold an internal command for a predetermined period in accordance with a predetermined latency by using an internal clock signal to produce a latency timeout signal, the latency counter comprising:

a single cyclic signal generator configured to cyclically produce 0-th to n-th base signals based on the internal clock signal; and a command delay circuit comprising 0-th to n-th latch elements and configured to latch the internal command by means of a p-th latch element (p is an integer; $0 \leq p \leq n$) in response to a q-th base signal (q is an integer; $0 \leq q \leq n$) and to output the latched internal command corresponding to the latency timeout signal therefrom in response to a r-th base signal (r is an integer; $0 \leq r \leq n$), where r=q+s if $q+s \leq n$ while r=q+s−(n+1) if q+s>n, s being a natural number equal to or less than n.

2. The semiconductor device according to claim 1, wherein the command delay circuit further comprising an entry/exit controller configured to produce 0-th to n-th entry signals and 0-th to n-th exit signals from the 0-th to the n-th base signals, the q-th base signal corresponding to a p-th entry signal, the r-th base signal corresponding to a p-th exit signal, the p-th latch elements latching the internal command in response to the p-th entry signal and outputting the latched internal command in response to the p-th exit signal.

3. The semiconductor device according to claim 2, wherein the entry/exit controller comprises 0-th to n-th selectors configured to produce the 0-th to the n-th entry signals, respectively, from the 0-th to the n-th base signals so that a p-th selector selecting the q-th base signal as the p-th entry signal.

4. The semiconductor device according to claim 3, the predetermined latency being variable and being given from outside of the semiconductor device, the semiconductor device further comprising an internal command generator configured to issue a shift signal indicative of s in response to the predetermined latency, wherein each of the 0-th to the n-th selectors selects one of the 0-th to the n-th base signals in accordance with the shift signal.

5. The semiconductor device according to claim 4, wherein p=r.

6. The semiconductor device according to claim 2, wherein the command delay circuit further comprising 0-th to n-th entry gates and 0-th to n-th exit gates, the 0-th to the n-th entry gates being configured to open, in response to the 0-th to the n-th entry signals, respectively, to allow the internal command to pass therethrough, the 0-th to the n-th latch elements being connected between the 0-th to the n-th entry gates and the 0-th to the n-th exit gates, respectively, and being configured to latch the internal command passing through the 0-th to the n-th entry gates, respectively, the 0-th to the n-th exit gates being configured to open, in response to the 0-th the to n-th exit signals, respectively, to allow the latched internal command to pass therethrough.

7. The semiconductor device according to claim 6, wherein the 0-th to the n-th latch elements are cross-coupled inverter based latches, respectively.

8. The semiconductor device according to claim 6, wherein the command delay circuit further comprising 0-th to n-th reset sections configured to reset the 0-th to the n-th latch elements when the 0-th to the n-th exit gates open, respectively.

9. The semiconductor device according to claim 2, wherein the entry/exit controller produces each of the 0-th to the n-th entry signals by delaying one of the 0-th to the n-th base signals by a predetermined delay period.

10. The semiconductor device according to claim 9, wherein the entry/exit controller further comprises 0-th to n-th delay elements configured to delay the 0-th to the n-th base signals by the predetermined delay period to produce 0-th to n-th delayed base signals, respectively, each of the 0-th to the n-th entry signals being produced based on one of the 0-th to the n-th delayed base signals.

11. The semiconductor device according to claim 9, wherein the predetermined delay period is equal to an inevitable delay period due to circuitry of the semiconductor device.

12. The semiconductor device according to claim 1, wherein the single cyclic signal generator is a single ring counter.

13. The semiconductor device according to claim 1, wherein:

the internal clock signal consists of multiple cycles; and the command delay circuit further comprises a register or t-bit shift register (t is a natural number larger than one) operative based on the internal clock signal, the register or two or more shift register being configured to delay the latched internal command by a period equal to one cycle or t cycles of the internal clock signal to produce the latency timeout signal.

14. The semiconductor device according to claim 13, the predetermined latency being equal to u (u is a natural number), wherein:

u=s+1 in a case of the register; or u=s+t in a case of the t-bit register.

15. The semiconductor device according to claim 1, the predetermined latency being read latency, write latency or ODT (On Die Termination) latency.

* * * * *